United States Patent
Sun et al.

(10) Patent No.: US 11,960,324 B2
(45) Date of Patent: Apr. 16, 2024

(54) SHAFT SUPPORT STRUCTURE, AND DISPLAY DEVICE AND ASSEMBLING METHOD THEREFOR

(71) Applicant: BOE TECHNOLOGY GROUP CO., LTD., Beijing (CN)

(72) Inventors: Baofeng Sun, Beijing (CN); Shangchieh Chu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 150 days.

(21) Appl. No.: 17/760,559

(22) PCT Filed: Apr. 9, 2021

(86) PCT No.: PCT/CN2021/086283
§ 371 (c)(1),
(2) Date: Mar. 15, 2022

(87) PCT Pub. No.: WO2021/232997
PCT Pub. Date: Nov. 25, 2021

(65) Prior Publication Data
US 2022/0413548 A1    Dec. 29, 2022

(30) Foreign Application Priority Data
May 19, 2020    (CN) .......................... 202010424122.9

(51) Int. Cl.
*G06F 1/16* (2006.01)
*H04M 1/02* (2006.01)
*H05K 5/02* (2006.01)

(52) U.S. Cl.
CPC ........ *G06F 1/1652* (2013.01); *H04M 1/0268* (2013.01); *G06F 1/1607* (2013.01); *H05K 5/0204* (2013.01)

(58) Field of Classification Search
CPC .......................... G06F 1/1652; H04M 1/0268
See application file for complete search history.

(56) References Cited

U.S. PATENT DOCUMENTS 10,244,641 B2 *  3/2019  Seo ................... H05K 5/0017
10,314,184 B2    6/2019  Choi et al.
(Continued)

FOREIGN PATENT DOCUMENTS

CN    205621366 U    10/2016
CN    208225377 U    12/2018
(Continued)

OTHER PUBLICATIONS

International Search Report & Written Opinion for International Application No. PCT/CN2021/086283 dated Jun. 29, 2021.
(Continued)

*Primary Examiner* — Nidhi Thaker
(74) *Attorney, Agent, or Firm* — Perilla Knox & Hildebrandt LLP; Kenneth A. Knox

(57) ABSTRACT

A rotating shaft supporting structure, a display device, and an assembling method therefor are described. The shaft support structure includes a rigid support part including a plurality of rigid support strips arranged in parallel, two first support plates arranged in parallel with the rigid support strips, and located on the two opposite sides of the rigid support part, and a flexible cladding layer, wrapped around the rigid support part and the two first support plates, joining a side, close to a flexible display panel, of the rigid support part, and sides, close to the flexible display panel, of the two first support plates as a whole.

15 Claims, 7 Drawing Sheets

(56) References Cited

U.S. PATENT DOCUMENTS

| | | | |
|---|---|---|---|
| 10,317,934 B2 | 6/2019 | Hampton et al. | |
| 10,383,239 B2 * | 8/2019 | Lee | H05K 5/0017 |
| 10,509,441 B2 * | 12/2019 | Wu | H04M 1/0268 |
| 10,516,119 B2 * | 12/2019 | Lee | H10K 50/8445 |
| 10,558,242 B2 | 2/2020 | Kim et al. | |
| 10,736,225 B2 | 8/2020 | Choi et al. | |
| 10,866,618 B2 * | 12/2020 | Yeom | G06F 1/1618 |
| 11,204,627 B2 * | 12/2021 | Park | H04M 1/0268 |
| 2016/0195901 A1 * | 7/2016 | Kauhaniemi | G06F 1/1652 |
| | | | 361/679.27 |
| 2016/0227645 A1 | 8/2016 | Hampton et al. | |
| 2018/0124937 A1 | 5/2018 | Choi et al. | |
| 2019/0196548 A1 | 6/2019 | Kim et al. | |
| 2019/0261524 A1 * | 8/2019 | Choi | G06F 1/1681 |

FOREIGN PATENT DOCUMENTS

| | | | | |
|---|---|---|---|---|
| CN | 109979323 A | 7/2019 | | |
| CN | 110459131 A | 11/2019 | | |
| CN | 111536144 A | 8/2020 | | |
| WO | WO-2018196290 A1 * | 11/2018 | | G06F 1/1616 |
| WO | 2021017247 A1 | 2/2021 | | |

OTHER PUBLICATIONS

First Office Action for CN Patent Application No. 202010424122.9 dated Dec. 30, 2020.

Second Office Action for CN Patent Application No. 202010424122.9 dated May 20, 2021.

* cited by examiner

SHAFT SUPPORT STRUCTURE, AND DISPLAY DEVICE AND ASSEMBLING METHOD THEREFOR

CROSS REFERENCE TO RELATED APPLICATIONS

The present disclosure is a national phase entry under 35 U.S.C. § 371 of International Application No. PCT/CN2021/086283, filed on Apr. 9, 2021, which claims the benefit of and priority to Chinese Patent Application No. 202010424122.9, filed on May 19, 2020, and entitled "ROTATING SHAFT SUPPORTING STRUCTURE, AND DISPLAY DEVICE AND ASSEMBLING METHOD THEREFOR," the contents of both of which are incorporated herein by reference in their entireties.

TECHNICAL FIELD

The present application relates to the field of display technology and, in particular to a shaft support structure, a display device including the shaft support structure, and a method for assembling the display device.

BACKGROUND

Flexible display panels are now gradually emerging to consumers, and the foldable nature of flexible display panels has greatly expanded the application fields of display panels.

However, at present, flexible display panels still face many difficulties. For example, after flexible display panel is folded and bent many times, the bending area of the flexible display panel is easy to warp and lead to creases, affecting the overall surface flatness. The warping is also prone to the problem of poor tactile sensation caused by the separation of the film layer, which may cause serious screen damage and thus reduce the user's operating experience.

SUMMARY

The present disclosure provides a shaft support structure, a display device including the shaft support structure, and a method for assembling the display device.

Additional aspects and advantages of the present application will be set forth in part in the following description, and will in part become apparent from the description or can be learned by practice of the present application.

According to an aspect of the present disclosure, there is provided a shaft support structure for carrying a flexible display panel. The flexible display panel includes a flat area and at least one bending area, and the shaft support structure includes: a rigid support part including a plurality of rigid support strips, where the plurality of rigid support strips are arranged in parallel with each other, a first gap is provided between two adjacent rigid support strips of the plurality of rigid support strips, a length direction of at least one of the plurality of rigid support strips is perpendicular to a bending direction of the flexible display panel, and an orthographic projection of the rigid support part on the flexible display panel is located in the bending area; two first support plates arranged parallel to each other with the plurality of rigid support strips, where the two first support plates are located on opposite sides of the rigid support part, a second gap is provided between a first support plate and the rigid support part, and orthographic projections of the two first support plates on the flexible display panel are located in the flat area; and a flexible cladding layer, wrapped around the rigid support part and the two first support plates, joining a side, close to the flexible display panel, of the rigid support part, and sides, close to the flexible display panel, of the two first support plates as a whole.

According to an aspect of the present disclosure, there is provided a display device including a frame; a shaft mechanism coupled to the frame, and configured to guide the frame to fold with a rotation of the shaft mechanism; the shaft support structure as described above, disposed on the frame and the shaft mechanism; and a flexible display panel disposed on the shaft support structure and the frame.

According to an aspect of the present disclosure, there is provided a method for assembling a display device including: providing a frame and a shaft mechanism; coupling the shaft mechanism to the frame; stretching a flexible cladding layer and fixing the stretched flexible cladding layer on the shaft mechanism; disposing a sliding plate on the frame, and fixing the sliding plate with an elastic member on the frame; pushing the sliding plate causing a side of the sliding plate to abut against a side surface of a first support plate; and bonding a flexible display panel to the flexible cladding layer, the sliding plate and the frame.

BRIEF DESCRIPTION OF THE DRAWINGS

The aforementioned and other features and advantages of the present disclosure will become more apparent by a detailed description of embodiments with reference to the accompanying drawings.

DETAILED DESCRIPTION

Figure 1:
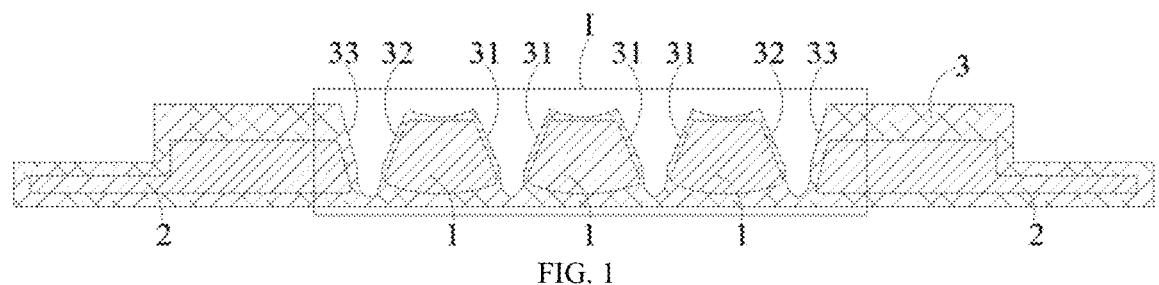
FIG. 1 is a structural schematic diagram of a shaft support structure according to an embodiment of the present disclosure.

Embodiments will now be described more fully with reference to the accompanying drawings. However, the embodiments can be implemented in a variety of forms and should not be construed as being limited to the embodiments set forth herein; rather, these embodiments are provided so that the application will be comprehensive and complete, and will fully convey the concept of the embodiments to those skilled in the art. The same reference numerals in the drawings indicate the same or similar structures, and thus their detailed description will be omitted.

In the related art, steel sheet is provided in the shaft area and magnet is provided in the frame to solve the warping problem in the bending area of the flexible display panel, and the magnet adsorbs the steel sheet. The installation of steel sheet in the shaft area may enhance the recovery force of the display panel, solve the warping problem in the bending area to a certain extent, and ensure the flatness of the whole display panel, but the actual effect shows that the steel sheet and magnet cannot solve the warping problem in the bending area of the flexible display panel. The fundamental reason is that it is difficult to match the deformation of the flexible display panel during the opening and closing process with the fitting surface of the steel sheet and the flexible display panel, while the installation of steel sheet in the shaft area leads to excessive tensile force on the flexible display panel during the bending process, and the steel sheet continuously squeezes the flexible display panel during the opening and closing process, which causes the flexible display panel to produce readily apparent creases and shortens the life of the flexible display panel. Moreover, due to the solid adhesive bonding between the flexible display panel and steel sheet, it is not enough to compensate the deformation of the flexible display panel, and the non-stretch ability of the steel sheet, which makes it difficult to match the deformation of the flexible display panel with the mechanism formed by the steel sheet and the magnet during the bending process, resulting in a gap caused by the sliding of the boundary of the flexible display panel, affecting the visual effect.

Figure 2:
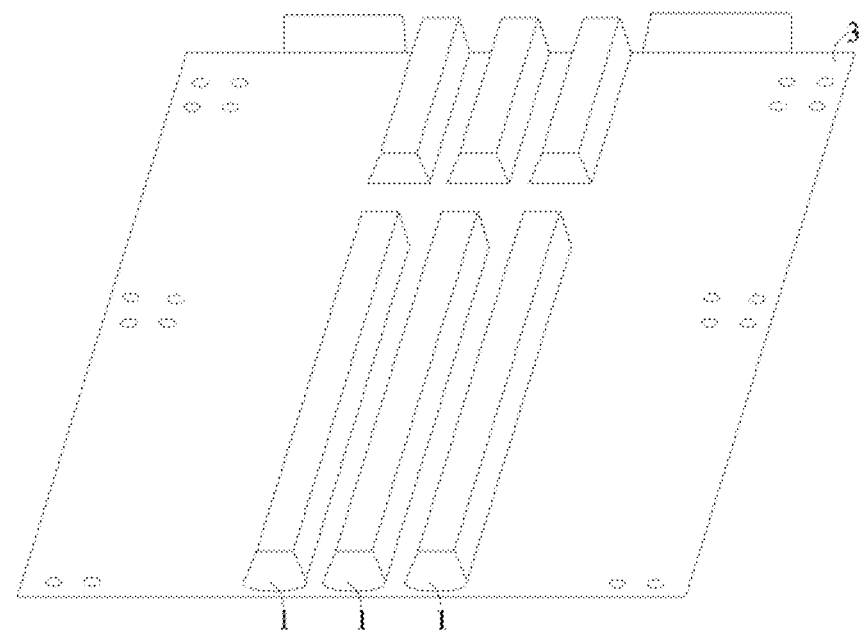
FIG. 2 is a schematic diagram of a three-dimensional structure of FIG. 1.
Figure 3:
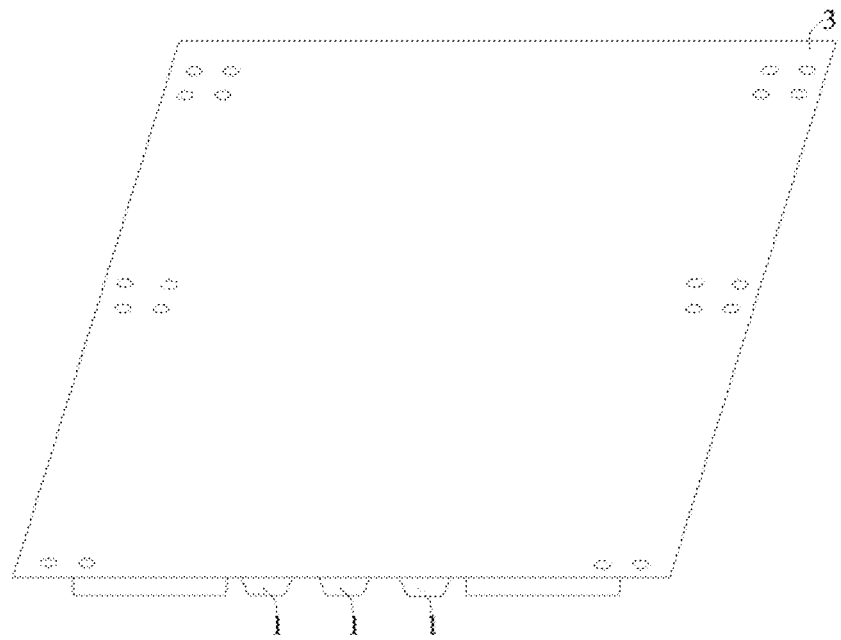
FIG. 3 is a schematic diagram of a three-dimensional structure of the back side of FIG. 2.

In this embodiment, a shaft support structure is first provided. Referring to FIG. 1, FIG. 2 and FIG. 3, the shaft support structure may include a rigid support part, a flexible cladding layer 3, and two first support panels 2. The rigid support part includes a plurality of rigid support strips 1, and the plurality of rigid support strips 1 are arranged in parallel with each other. A first gap is provided between two adjacent rigid support parts 1. A length direction of the rigid support strips 1 is perpendicular to a bending direction of the flexible display panel. An orthographic projection of the rigid support part on the flexible display panel is located in the bending area. The two first support plates 2 are arranged parallel to each other with the rigid support strips 1, and are located on opposite sides of the rigid support part. A second gap is provided between the first support plate 2 and the rigid support part. Orthographic projections of the two first support plates 2 on the flexible display panel are located in the flat area. The flexible cladding layer 3 is wrapped around the rigid support part and the two first support plates, joining the rigid support part and the two first support plates as a whole.

In this embodiment, the rigid support part includes three rigid support strips 1, the three rigid support strips 1 are arranged parallel to each other, and the first gap is provided between two adjacent rigid support strips 1. The first gap ranges from approximately 0.2 mm to 1.5 mm.

The cross-sectional shape of the rigid support strip 1 perpendicular to the length direction of the rigid support strip 1 may be a truncated sector (i.e., the triangle at the top of the sector is truncated). In some embodiments, the surface of the rigid support strip 1 close to the flexible display panel is set as part of a cylindrical surface, and the part of the cylindrical surface has a central angle equal to 60 degrees or slightly less than 60 degrees. In the bending state, the sum of the central angles, of these parts of the cylindrical surfaces, of the three rigid support strips 1 is approximately 180 degrees, so that in the bending state, the shaft area is closer to the complete half-cylindrical surface, providing a better base for the flexible display panel. The surface of the rigid support strip away from the flexible display panel may be set as a flat surface.

For the rigid support strip 1 in the middle, both sides of the rigid support strip 1 close to the adjacent other rigid support strip 1 are set as inclined surfaces with an inclination angle of 22.5 degrees. For each of the rigid support strips 1 on two sides of the rigid support strip 1 in the middle, one side of the rigid support strip 1 close to the adjacent other rigid support strip 1 and one side of the rigid support strip 1 close to the first support plate 2 are set as inclined surfaces with an inclination angle of 22.5 degrees. The side of the first support plate 2 close to the rigid support part is set as an inclined surface with an inclination angle of 22.5 degrees.

Since each rigid support strip 1 has two inclined surfaces, three rigid support strips 1 have six inclined surfaces, and the sides of the first support plates 2 close the rigid support strip 1 also needs to be set as inclined surfaces, there are eight inclined surfaces cooperating with each other, and the inclined angle of the inclined surface is greater than or equal to 180 degrees/8=22.5 degrees.

In this way, when the shaft support structure is in the maximum bending state (i.e., bending 180 degrees), all sides of the rigid support strips 1 and the sides of the first support plates 2 can be fully fitted to provide support for the flexible display panel.

In addition, it should be understood that the inclination angle of the side of the rigid support strip 1 or the first support plate 2 may be greater than 22.5 degrees, as long as there will be no interference during bending.

One or more grooves may be provided in the rigid support strips 1 to fit with a shaft mechanism 8.

In some other embodiments of the present disclosure, the cross-sectional shape of the rigid support strip 1 perpendicular to the length direction of the rigid support strip 1 may be a segment of a ring. In some embodiments, the surface of the rigid support strip 1 close to the flexible display panel is set as part of a cylindrical surface, and the part of the cylindrical surface has a central angle equal to 60 degrees or slightly less than 60 degrees. In the bending state, the sum of the central angles, of these parts of the cylindrical surfaces, of the three rigid support strips 1 is approximately 180 degrees, so that in the bending state, the shaft area is closer to the complete half-cylindrical surface, providing a better base for the flexible display panel.

The side of the rigid support strip 1 away from the flexible display panel is set as part of a cylindrical surface, and the part of the cylindrical surface has a central angle equal to 60 degrees or slightly less than 60 degrees. In the bending state, the sum of the central angles, of these parts of the cylindrical surfaces, of the three rigid support strips 1 is approximately 180 degrees, so that in the bending state, the shaft area is closer to the complete half-cylindrical surface. It should be understood that in the case where the side of the rigid support strip 1 away from the display panel is set to be flat, the above effect may also be achieved by setting the side of the flexible cladding layer 3 away from the flexible display panel as part of a cylindrical surface during the subsequent formation of the flexible cladding layer 3.

All corners and edges of the rigid support strip 1 are set to be rounded chamfers. On the one hand, the sharp corners are not easy to be injection-molded during the injection molding process, and the rounded chamfers are set to facilitate the subsequent formation of the flexible cladding layer 3. On the other hand, the rounded chamfers are set to avoid subsequent damage to the flexible cladding layer 3 at sharp corners during the bending process.

In addition, in some other embodiments of the present disclosure, the number of rigid support strips 1 may be four, in which case the side of the rigid support strip 1 close to the display panel is set as part of a cylindrical surface, and the part of the cylindrical surface has a central angle equal to 45 degrees or slightly less than 45 degrees. The sides of the rigid support strips and the sides of the first support plates 2 are set as inclined surfaces with an inclination angle greater than or equal to 18 degrees. Of course, the number of rigid support strips 1 may be two, five or more, and the specific data of rigid support strips 1 are not repeated here, and may be obtained by the above calculation.

In this embodiment, the orthographic projections of the two first support plates 2 on the flexible display panel are located in the flat area, and the two first support plates 2 are arranged parallel to each other with the rigid support strips 1 which means that the side of the first support plate 2 close to the rigid support strip is parallel to the central axis of the rigid support strip 1. The two first support plates 2 are located on opposite sides of the rigid support part, i.e., each first support plate 2 is provided on one side of the rigid support part. A second gap is provided between the rigid support strip 1 and the first support plate 2, and the second gap is the interval space between the side of the first support plate 2 close to the rigid support strip 1 and the side of the rigid support strip 1 close to the first support plate 2, and ranges from about 0.2 mm to 1.5 mm. The first support plate 2 may provide a flat surface for the non-bending area of the flexible display panel. The side of the first support plate 2 close to the flexible display panel and the side of the rigid support strip 1 close to the flexible display panel may be substantially on the same plane, facilitating subsequent formation of a flatter flexible cladding layer 3. The side of the first support plate 2 close to the rigid support part is set as an inclined surface, and the inclination angle of the inclined surface has been described in detail above, so it will not be repeated here.

In this embodiment, the flexible cladding layer 3 is wrapped around the rigid support part and the two support panels, and joins the side of the rigid support part close to the flexible display panel and the sides of the two support panels close to the flexible display panel as a whole. That is, the flexible cladding layer 3 can completely wrap the rigid support part and the two support panels, and the flexible cladding layer 3 is formed within the first gap between the two rigid support strips 1 and within the second gap between the first support panel 2 and the rigid support part. Referring to FIG. 1, the flexible cladding layer 3 is a thin film structure, located only on the side of the first gap and the second gap close to the flexible display panel, thereby joining the side of the rigid support part close to the flexible display panel and the side of the two support plates close to the flexible display panel as a whole, not only providing a flat substrate for the flexible display panel, but also making the shaft support structure more flexible and stretchable, and more easy to match the amount of deformation during the bending and unfolding of the flexible display panel and solve the problem of the sliding gap between the flexible display panel and the edge of a frame 7. The rigid support part and the first support plate 2 provide supportability, and the flexible cladding layer 3 avoids direct contact between the rigid support part and the first support plate 2 and the flexible display panel, reducing the force of the shaft area on the flexible display panel during the bending process, and the creasing problem is significantly improved.

Figure 4:
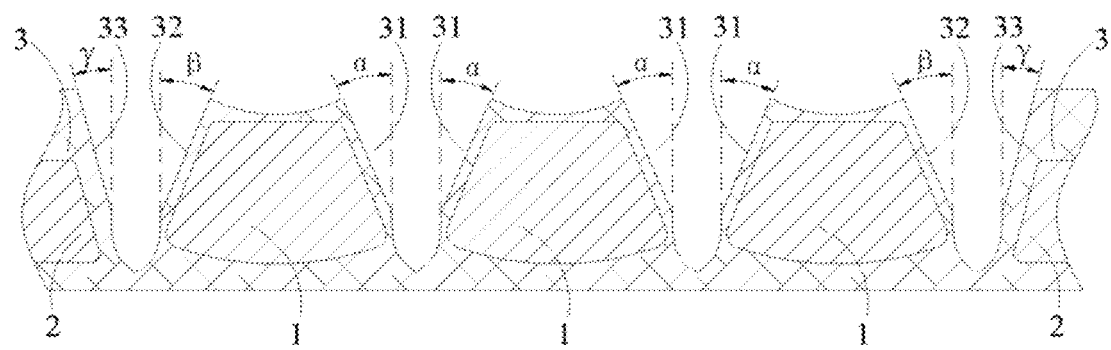
FIG. 4 is a partially enlarged schematic diagram of the portion referred to by "I" in FIG. 1.

The flexible cladding layer 3 is made by a mold injection process. Referring to FIG. 4, the flexible cladding layer may include a first inclined surface 31, a second inclined surface 32 and a third inclined surface 33. The first inclined surface 31 is located on a side of the rigid support strip 1 close to the adjacent other rigid support strip 1 with an inclined angle α greater than or equal to 22.5 degrees. The second inclined surface 32 is located on a side of the rigid support strip 1 close to the first support plate 2 with an inclined angle β greater than or equal to 22.5 degrees. The third inclined surface 33 is located on a side of the first support plate 2 close to the rigid support part with an inclined angle γ greater than or equal to 22.5 degrees.

In the case where the inclined angles of the aforementioned sides of the rigid support strip 1 and the first support plate 2 are set to be greater than or equal to 22.5 degrees, the flexible cladding layer 3 can evenly warp the rigid support part and the two first support plates, so that inclined angles of the first inclined surface 31, the second inclined surface 32, and the third inclined surface 33 are all greater than or equal to 22.5 degrees. Of course, when the inclined angles of the sides of the rigid support strip 1 and the first support plate 2 does not meet the requirements, different thickness of the flexible cladding layer 3 can be set as needed to make to the inclined angles of the first inclined surface 31, the second inclined surface 32, and the third inclined surface 33 are all greater than or equal to 22.5 degrees.

Figure 5:
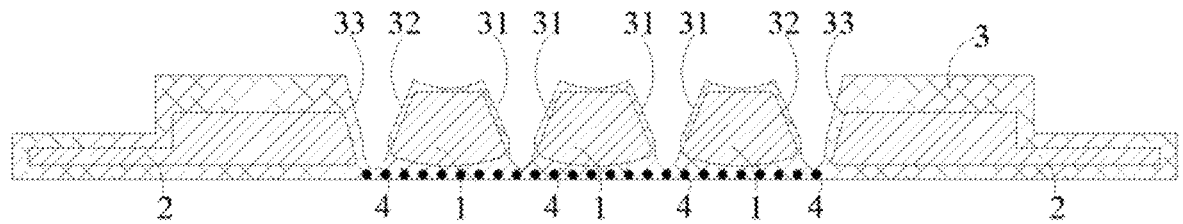
FIG. 5 is a structural schematic diagram of a shaft support structure according to another embodiment of the present disclosure.
Figure 6:
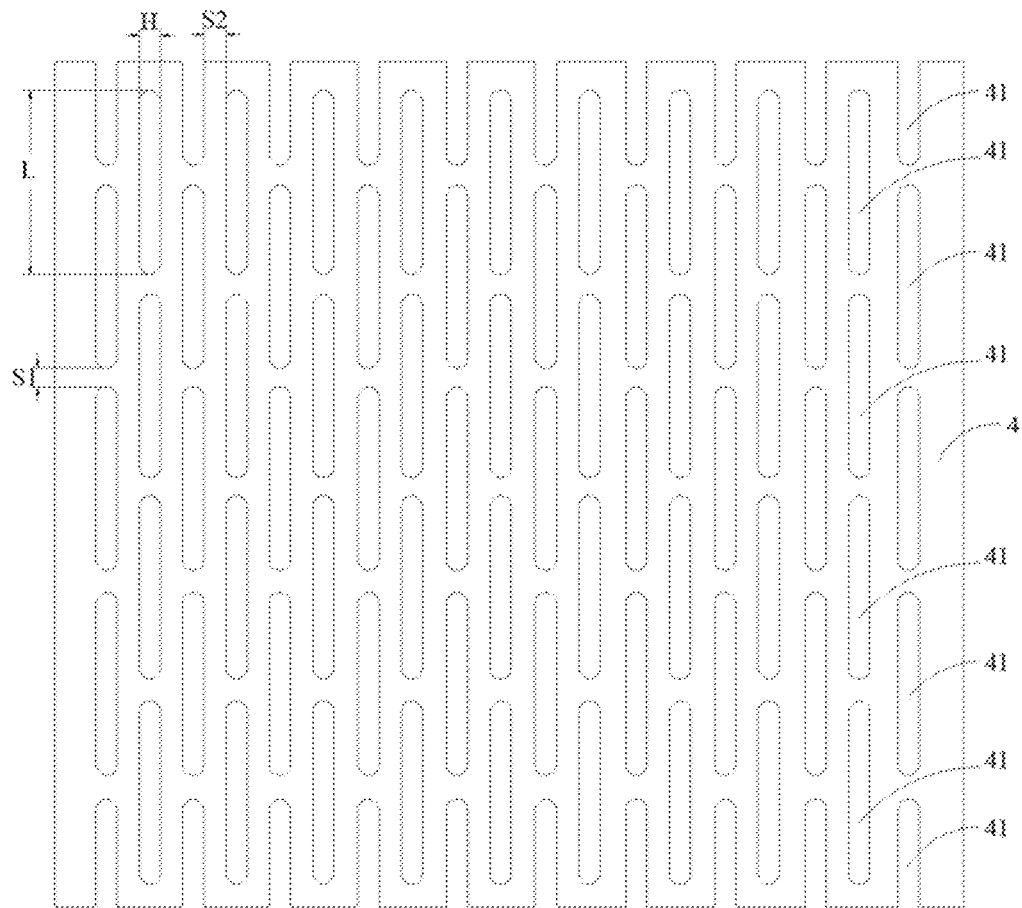
FIG. 6 is a structural schematic diagram of a second support plate in FIG. 5.

In some other embodiments of this application, the shaft support structure may further include a second support plate 4. Referring to FIG. 5 and FIG. 6, the second support plate 4 is provided on the side of the rigid support part close to the flexible display panel, and has a plurality of through holes arranged in an array. The flexible cladding layer 3 is wrapped around the second support plate 4 and is filled into the plurality of through holes.

In some embodiments, the through holes may be oblong holes 41. Referring to FIG. 6, a plurality of rows of oblong holes 41 are provided on the second support plate 4, and a row of oblong holes 41 includes a plurality of oblong holes 41. The oblong holes 41 in two adjacent rows are arranged in a mutually staggered manner. The arrangement of oblong holes 41 in the odd rows may be the same, the arrangement of oblong holes 41 in the even rows may be the same, and the oblong holes 41 of the even-numbered rows and the odd-numbered rows are arranged in a staggered manner with each other.

The length L of the oblong hole 41 may be greater than or equal to 2 mm and less than or equal to 6 mm. The width H of the oblong hole may be greater than or equal to 0.1 mm and less than or equal to 0.6 mm. The gaps S1 and S2 between two adjacent oblong holes 41 may be greater than or equal to 0.1 mm and less than or equal to 0.5 mm. In some other embodiments, the through holes may be round holes, rectangular holes, etc.

The shaft support structure provided with the second support plate 4 has both stretchability and supportability. The following simulations illustrate the advantages of the shaft support structure of the present disclosure in terms of stretchability and supportability.

Figure 7:
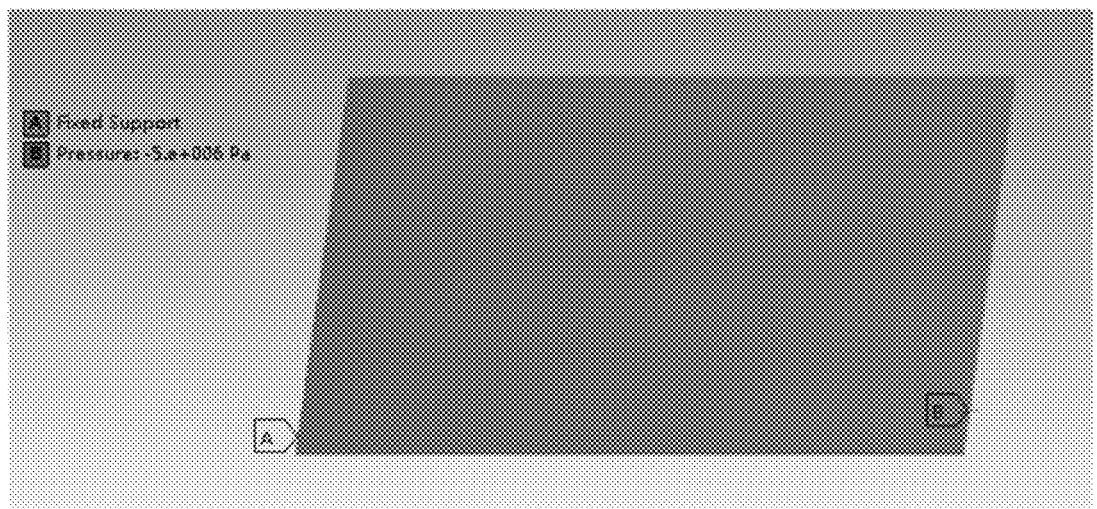
FIG. 7 is a schematic diagram of a simulation of a steel sheet model in the related art.
Figure 8:
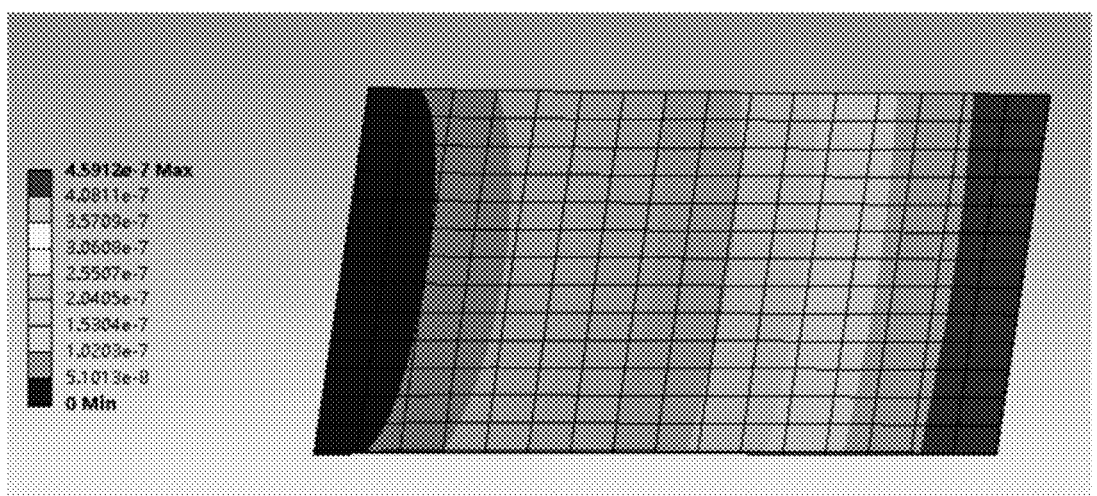
FIG. 8 is a schematic diagram of a simulation of the steel sheet model in the related art in FIG. 7 after stretching.

Referring to FIG. 7, which is a schematic diagram of a simulation of a steel sheet model in the related art, the A end is fixed and the B end is stretched. Referring to FIG. 8, which is a schematic diagram of a simulation of the steel sheet model in the related art after stretching, the simulation condition is that a tensile force of 5N acts on the cross-section (B end) with the equivalent uniform pressure −5 Mpa, under the action of 5 Mpa tensile force, the maximum tensile deformation of the steel sheet is only 4.59e-4 mm, indicating that the steel sheet has no deformation compensation during the opening and closing process, which in turn leads to the flexible display panel in the bending area to produce creases easily with the increase in the number of bending.

Figure 9:
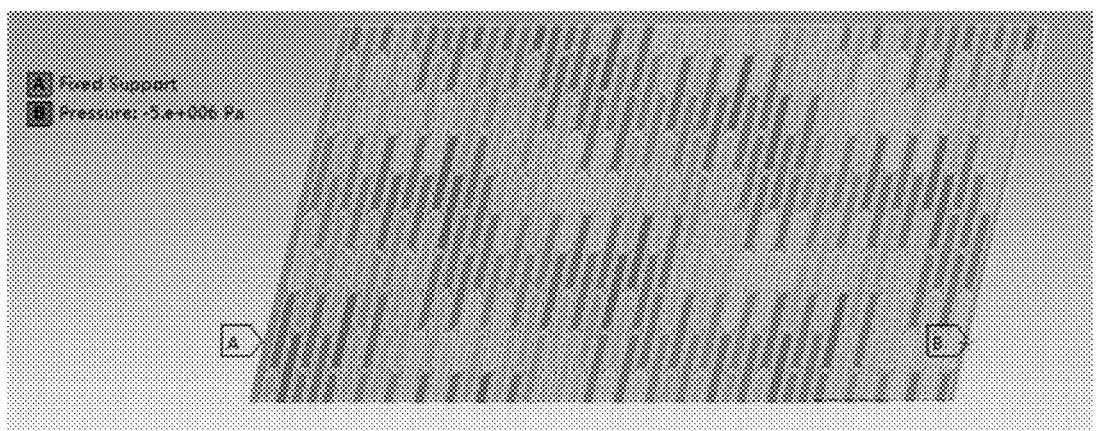
FIG. 9 is a schematic diagram of a simulation of a shaft support structure model of the present disclosure.
Figure 10:
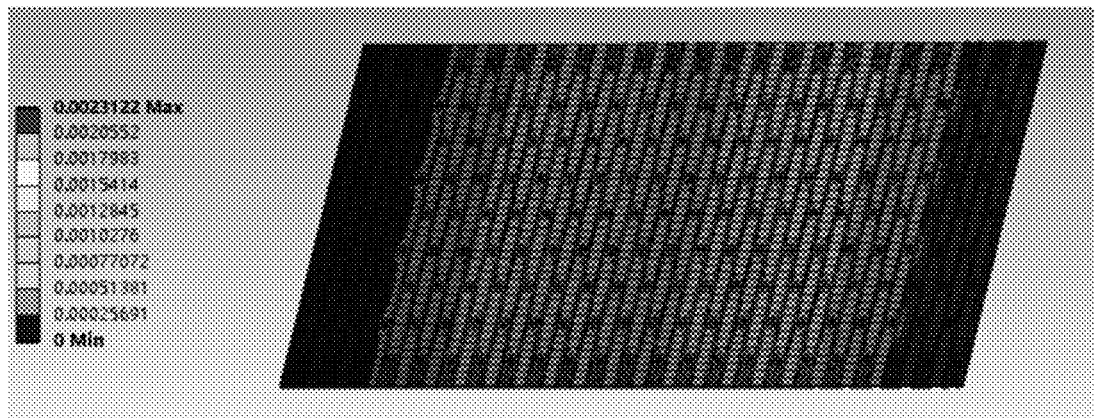
FIG. 10 is a schematic diagram of a simulation of the shaft support structure model of the present disclosure in FIG. 9 after stretching.

Referring to FIG. 9, which is a schematic diagram of a simulation of a shaft support structure model of the present disclosure, the A end is fixed and the B end is stretched. Referring to FIG. 10, which is a schematic diagram of a simulation of the shaft support structure model of the present disclosure after stretching, the simulation condition is that a tensile force of 5N acts on the cross-section (B end) with the equivalent uniform pressure −5 Mpa, under the action of 5 Mpa tensile force, the tensile deformation of the structure is 2.31 mm, which can provide sufficient deformation compensation for the flexible display panel and improve the problem of warping and creasing of the flexible display panel.

Figure 11:
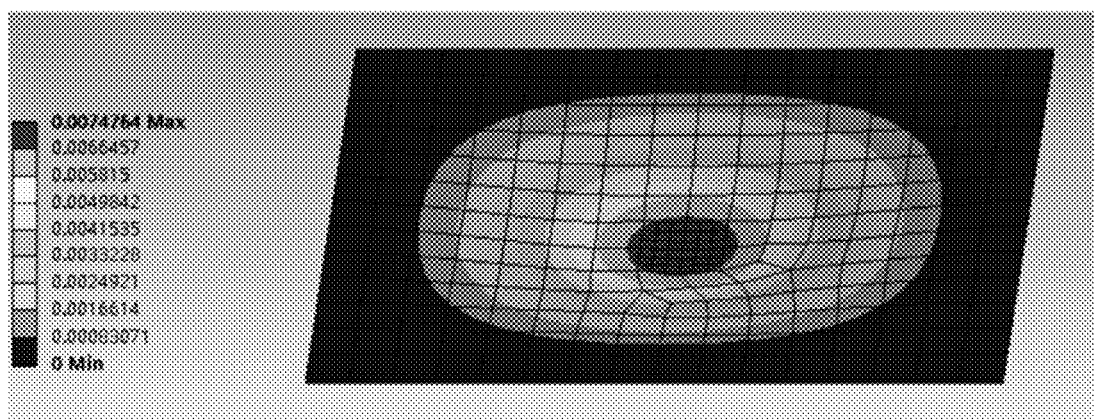
FIG. 11 is a schematic diagram of a simulation of the amount of deformation by single-point touch for a shaft support structure of the present disclosure without a second support plate.

Referring to FIG. 11, which is a schematic diagram of a simulation of the amount of deformation by single-point touch for a shaft support structure of the present disclosure without the second support plate 4, the simulation conditions are: in the pressing process of simulating finger touch, the vertical pressure 0.5N acts on the center, the structure boundary is fixed, the finger contact area is 5 mm$^2$, and the equivalent pressure is 0.1 Mpa, resulting in a single-point touch deformation of 7.47 mm, which shows that this embodiment has good tensile properties, the support properties are significantly reduced.

Figure 12:
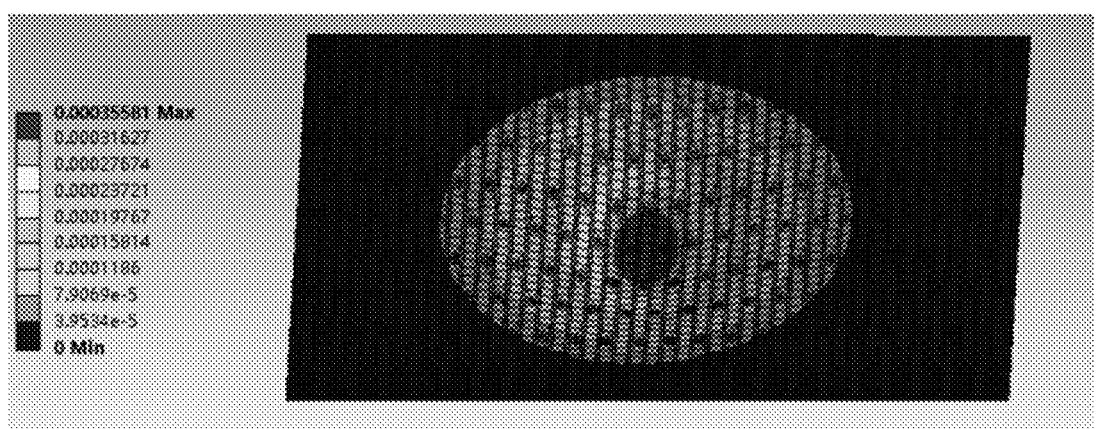
FIG. 12 is a schematic diagram of a simulation of the amount of deformation by single-point touch for a shaft support structure of the present disclosure including a second support plate.

Referring to FIG. 12, which is a schematic diagram of a simulation of the amount of deformation by single-point touch for a shaft support structure of the present disclosure including the second support plate 4, the simulation conditions are: in the pressing process of simulating finger touch, the vertical pressure 0.5N acts on the center, the structure boundary is fixed, the finger contact area is 5 mm$^2$, the equivalent pressure is 0.1 Mpa, resulting in a single-point touch deformation of 0.356 mm, which shows that the support properties are significantly improved.

The above design and simulation results show that the shaft support structure including the second support plate 4 is both flexible and supportive, and can better compensate for the deformation of the flexible display panel during the folding and unfolding process, thus solving the problems of warping, creasing and insufficient support in the bending area of the flexible display panel.

Figure 13:
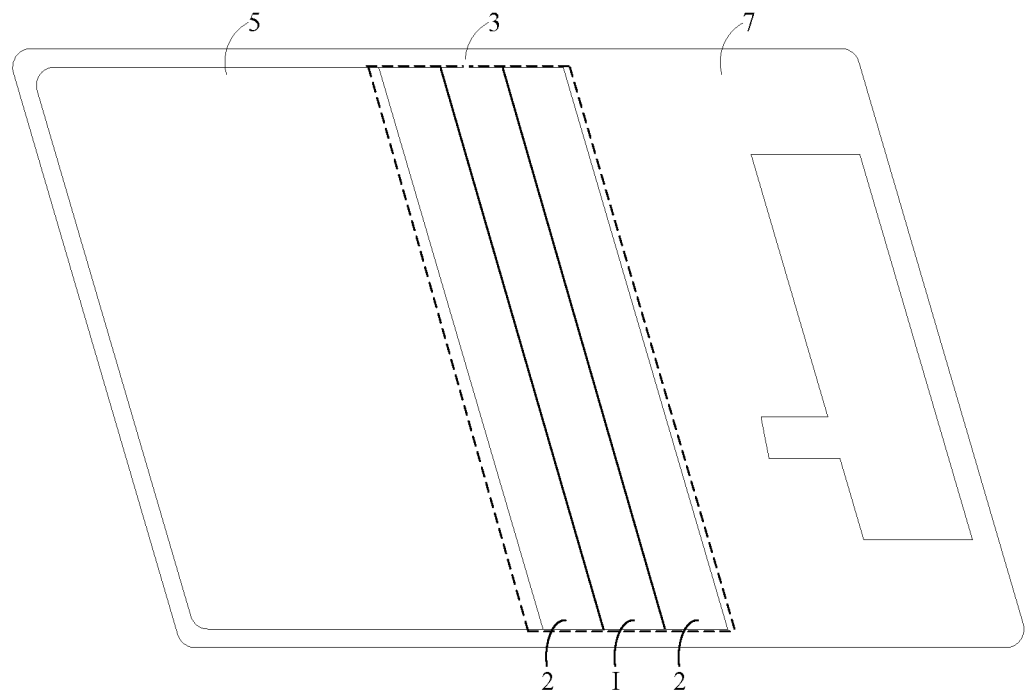
FIG. 13 is a schematic diagram of a three-dimensional structure of a shaft support structure of the present disclosure after installation to a frame.
Figure 14:
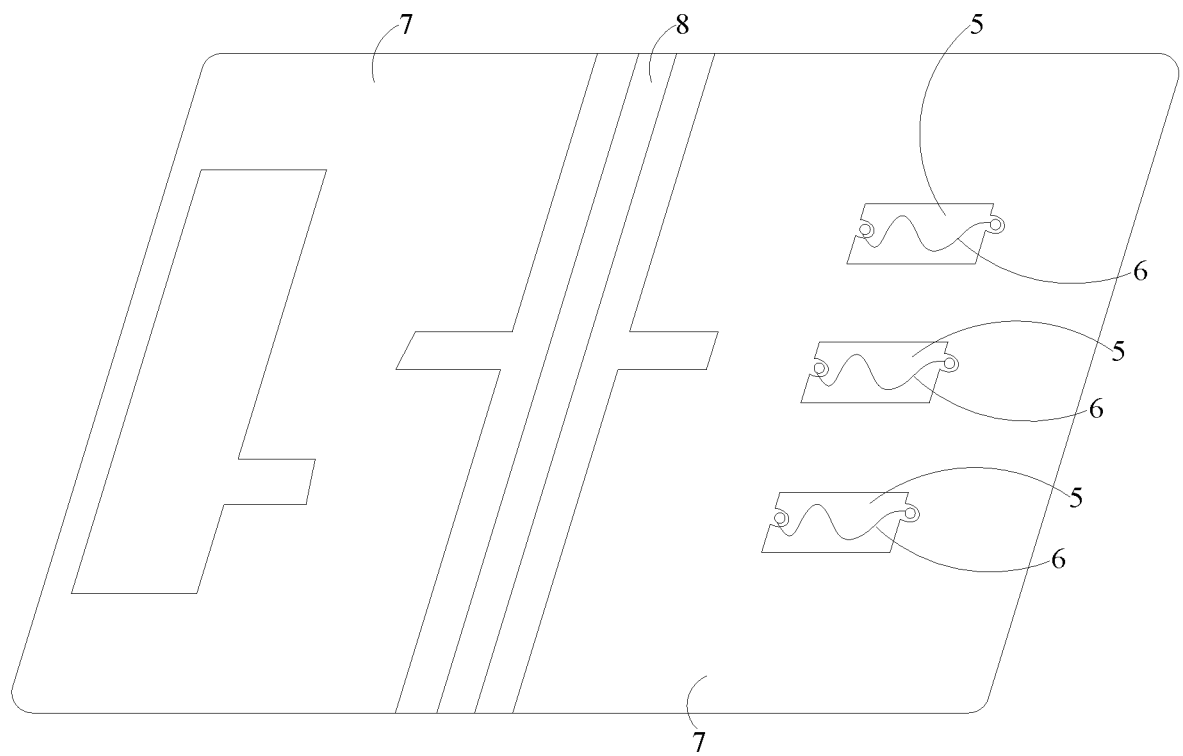
FIG. 14 is a schematic diagram of a three-dimensional structure of the back side of FIG. 13.

In this embodiment, referring to FIG. 13 and FIG. 14, the shaft support structure may further include a sliding plate 5 and a compression spring 6. The sliding plate 5 is provided on the side of the first support plate 2 away from the rigid support strip 1 and used to carry part of the flexible display panel. In some other embodiments, the flexible display panel carried on the sliding plate 5 is the part of the flexible display panel that needs to be folded with the rotation of the shaft mechanism 8. One end of the compression spring 6 is connected to the sliding plate 5, and the other end of the compression spring 6 is connected to the frame 7. The compression spring 6 will continuously provide a pushing force to stretch the sliding plate 5 and the flexible display panel fixed on the sliding plate 5. When the flexible display panel is bent or folded, the sliding plate 5, and the frame 7 will not slide, and the compression spring 6 will be compressed because of the case sliding. Due to the pushing force of the spring 6, the sliding plate will continuously exert a pushing force to the flexible display panel during the whole process of opening and closing to ensure the flatness of the flexible display panel.

Furthermore, this embodiment provides a display device, which may include a frame 7, a shaft mechanism 8, a flexible display panel (not shown), and the shaft support structure as described above, as shown with reference to FIG. 13 and FIG. 14. The shaft mechanism 8 is coupled to the frame 7, and the frame 7 may be folded with the rotation of the shaft mechanism 8. The shaft support structure is disposed on top of the frame 7 and the shaft mechanism 8. The flexible display panel is disposed on top of the shaft support structure and the frame 7. The specific structure of the shaft support structure has been described in detail above, so it will not be repeated here.

Figure 15:
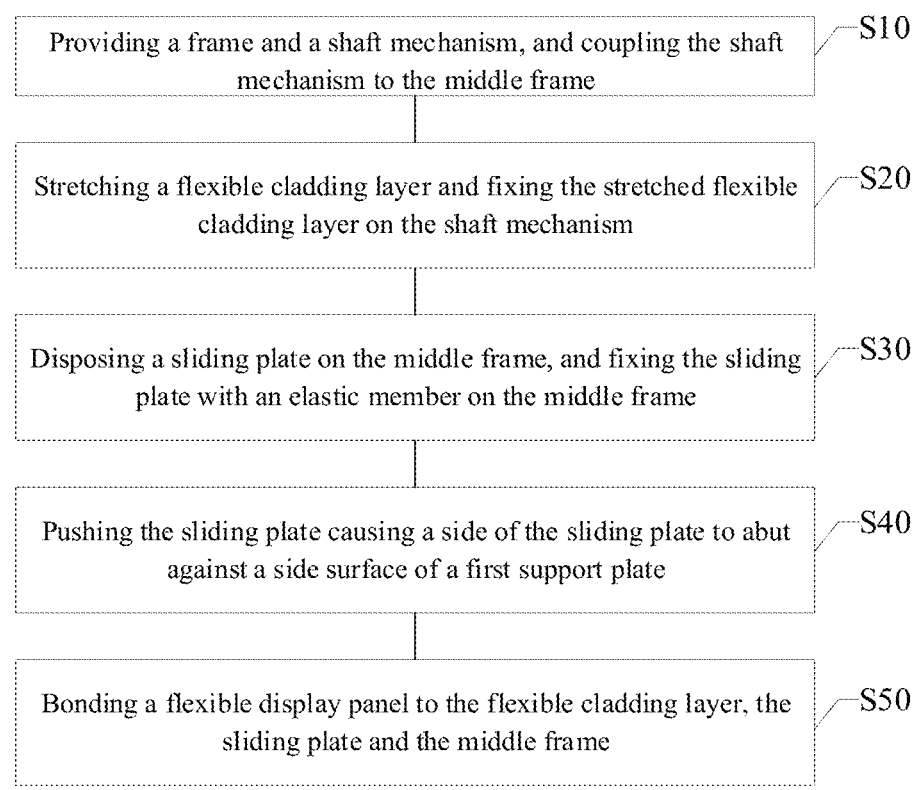
FIG. 15 is a schematic block diagram of the flow of a method for assembling a display device according to an embodiment of the present disclosure.

This embodiment further provides a method for assembling a display device, which, with reference to FIG. 15, may include the following steps.

Step S10, providing a frame 7 and a shaft mechanism 8, and coupling the shaft mechanism 8 on the frame 7.

Step S20, stretching a flexible cladding layer 3 and fixing the stretched flexible cladding layer on the shaft mechanism 8.

Step S30, disposing a sliding plate 5 on the frame 7, and fixing the sliding plate 5 with an elastic member on the frame 7.

Step S40, pushing the sliding plate 5 causing a side of the sliding plate 5 to abut against a side surface of a first support plate 2.

Step S50, bonding a flexible display panel to the flexible cladding layer 3, the sliding plate 5 and the frame 7.

In this embodiment, stretching the flexible cladding layer 3 may provide an initial amount of stretch. Pushing the sliding panel 5 until one side of the sliding panel 5 abuts against one side of the first support plate 2 allows the elastic member to be compressed to provide continuous pushing force to the sliding panel 5. The flexible display panel is bonded to the flexible cladding layer 3, the sliding plate 5, and the frame 7 using an adhesive combined with solid glue and water glue.

The features, structures or characteristics described above may be combined in any suitable manner in one or more embodiments and, if possible, the features discussed in the various embodiments are interchangeable. In the above description, many specific details are provided thereby giving a full understanding of the embodiments of the present disclosure. One skilled in the art will recognize, however, that aspects of the present application may be practiced without one or more of the specific details, or with other methods, components, materials, etc. being employed. In other instances, well-known structures, materials, or operations are not shown or described in detail to avoid obscuring aspects of the application.

The terms "about" and "approximately" are used in this specification to generally mean thin 20%, specifically, in some embodiments, within 10%, and more specifically, in some embodiments, within 5% of a given value or range. The quantities given herein are approximate quantities, meaning that "about," "approximately," "roughly," "approximately", and "generally" may still be implied without specific specification.

Although relative terms such as "above" and "below" are used in this specification to describe the relative relationship of one component of the icon to another, these terms are used in this specification only for convenience, for example, according to the orientation of the examples described in the accompanying drawings. It should be understood that if the device of the icon is turned upside down, the component described as being "above" will become the component described as being "below". When a structure is provided "on" other structures, it may mean that the structure is integrally formed on other structures, or the structure is "directly" arranged on other structures, or the structure is "indirectly" arranged on other structures through another structure.

In this specification, the terms "one", "a", "the", "said" and "at least one" are used to indicate the presence of one or more elements/components/etc. The terms "comprise", "include" and "have" are used to indicate an open-ended inclusion and to mean that there may be additional elements/components/etc. in addition to the listed elements/components/etc. The terms "first", "second", and "third" are used only as an indication of the existence of one or more elements/components/etc. The terms "first", "second" and "third" are used only as indications, not as limitations on the numbers of objects.

It should be understood that the present disclosure does not limit its embodiments to the detailed construction and arrangement of the components presented in this specification, and may have other embodiments that can be realized and performed in a variety of ways. The aforementioned variant and modified forms fall within the scope of the present disclosure. It should be understood that the present application as disclosed and limited by this specification extends to all alternative combinations of two or more individual features mentioned or apparent in the text and/or the accompanying drawings. All these different combinations constitute multiple alternative aspects of the present disclosure. The embodiments described in this specification illustrate the best ways known for implementing the present application and will enable those skilled in the art to utilize the application.

What is claimed is:

1. A shaft support structure for carrying a flexible display panel having a flat area and at least one bending area, the shaft support structure comprising:
   a rigid support part comprising a plurality of rigid support strips, wherein: the plurality of rigid support strips are arranged in parallel with each other; a first gap is provided between two adjacent rigid support strips of the plurality of rigid support strips; a length direction of at least one of the plurality of rigid support strips is perpendicular to a bending direction of the flexible display panel; and an orthographic projection of the rigid support part on the flexible display panel is located in the bending area;
   two first support plates arranged parallel to each other with the plurality of rigid support strips, wherein: the two first support plates are located on opposite sides of the rigid support part; a second gap is provided between a first support plate and the rigid support part; and orthographic projections of the two first support plates on the flexible display panel are located in the flat area; and
   a flexible cladding layer wrapped around the rigid support part and the two first support plates, joining a side, close to the flexible display panel, of the rigid support part, and sides, close to the flexible display panel, of the two first support plates as a whole; wherein:
   the plurality of rigid support strips comprises three rigid support strips;
   a surface, close to the flexible display panel, of at least one of the three rigid support strips is part of a cylindrical surface;
   the part of the cylindrical surface protrudes toward the flexible display panel;
   a central angle corresponding to the part of the cylindrical surface is less than or equal to 60 degrees; and
   the flexible cladding layer comprises:
      a second inclined surface, on a side surface of at least one of the plurality of rigid support strips, adjacent to the first support plate, with an inclination angle greater than or equal to 22.5 degrees;
      a first inclined surface, on a side surface of any one of the plurality of rigid support strips excluding the second inclined surface, with an inclination angle greater than or equal to 22.5 degrees; and
      a third inclined surface, on a side surface, close to the rigid support part, of one of the two first support plates, with an inclination angle greater than or equal to 22.5 degrees.

2. The shaft support structure of claim 1, further comprising: a second support plate, provided on the side, close to the flexible display panel, of the rigid support part, having a plurality of through holes arranged in an array.

3. The shaft support structure of claim 2, wherein the flexible cladding layer is wrapped around the second support plate and filled into the plurality of through holes.

4. The shaft support structure of claim 2, wherein at least one of the plurality of through holes is an oblong hole, and a length direction of the oblong hole is perpendicular to the bending direction of the flexible display panel.

5. The shaft support structure of claim 4, wherein
   a length of the oblong hole is greater than or equal to 2 mm and less than or equal to 6 mm;
   a width of the oblong hole is greater than or equal to 0.1 mm and less than or equal to 0.6 mm; and
   an interval between two adjacent oblong holes of the plurality of through holes is greater than or equal to 0.1 mm and less than or equal to 0.5 mm.

6. The shaft support structure of claim 1, wherein
   a surface, away from the flexible display panel, of the flexible cladding layer is part of a cylindrical surface,
   the part of the cylindrical surface is recessed toward the flexible display panel, and
   a central angle corresponding to the part of the cylindrical surface is less than or equal to 60 degrees.

7. The shaft support structure of claim 1, further comprising:
   a sliding plate, provided on a side, away from the rigid support part, of a first support plate, an orthographic projection of the sliding plate on the flexible display panel being located in the flat area; and
   an elastic member, with one end connected to the sliding plate and the other end configured to connect to a frame.

8. The shaft support structure of claim 7, wherein the elastic member is a compression spring.

9. A display device, comprising:
a frame;
a shaft mechanism coupled to the frame, and configured to guide the frame to fold with a rotation of the shaft mechanism;
a shaft support structure, disposed on the frame and the shaft mechanism; and
a flexible display panel disposed on the shaft support structure and the frame;
wherein the shaft support structure comprises:
  a rigid support part comprising a plurality of rigid support strips, wherein: the plurality of rigid support strips are arranged in parallel with each other; a first gap is provided between two adjacent rigid support strips of the plurality of rigid support strips; a length direction of at least one of the plurality of rigid support strips is perpendicular to a bending direction of the flexible display panel; and an orthographic projection of the rigid support part on the flexible display panel is located in the bending area;
  two first support plates arranged parallel to each other with the plurality of rigid support strips, wherein: the two first support plates are located on opposite sides of the rigid support part; a second gap is provided between a first support plate and the rigid support part; and orthographic projections of the two first support plates on the flexible display panel are located in the flat area; and
  a flexible cladding layer, wrapped around the rigid support part and the two first support plates, joining a side, close to the flexible display panel, of the rigid support part, and sides, close to the flexible display panel, of the two first support plates as a whole; wherein:
the plurality of rigid support strips comprises three rigid support strips;
a surface, close to the flexible display panel, of at least one of the three rigid support strips is part of a cylindrical surface;
the part of the cylindrical surface protrudes toward the flexible display Panel;
a central angle corresponding to the part of the cylindrical surface is less than or equal to 60 degrees; and
the flexible cladding layer comprises:
  a second inclined surface, on a side surface of at least one of the plurality of rigid support strips, adjacent to the first support plate, with an inclination angle greater than or equal to 22.5 degrees;
  a first inclined surface, on a side surface of any one of the plurality of rigid support strips excluding the second inclined surface, with an inclination angle greater than or equal to 22.5 degrees; and
  a third inclined surface, on a side surface, close to the rigid support part, of one of the two first support plates, with an inclination angle greater than or equal to 22.5 degrees.

10. The display device of claim 9, wherein the shaft support structure further comprises:
a second support plate, provided on the side, close to the flexible display panel, of the rigid support part, having a plurality of through holes arranged in an array.

11. The display device of claim 10, wherein the flexible cladding layer is wrapped around the second support plate and filled into the plurality of through holes.

12. The display device of claim 10, wherein at least one of the plurality of through holes is an oblong hole, and a length direction of the oblong hole is perpendicular to the bending direction of the flexible display panel.

13. The display device of claim 12, wherein:
a length of the oblong hole is greater than or equal to 2 mm and less than or equal to 6 mm;
a width of the oblong hole is greater than or equal to 0.1 mm and less than or equal to 0.6 mm; and
an interval between two adjacent oblong holes of the plurality of through holes is greater than or equal to 0.1 mm and less than or equal to 0.5 mm.

14. The display device of claim 9, wherein:
a surface, away from the flexible display panel, of the flexible cladding layer is part of a cylindrical surface;
the part of the cylindrical surface is recessed toward the flexible display panel; and
a central angle corresponding to the part of the cylindrical surface is less than or equal to 60 degrees.

15. A method for assembling a display device, comprising:
providing a frame and a shaft mechanism;
coupling the shaft mechanism to the frame;
stretching a flexible cladding layer of a shaft support structure and fixing the stretched flexible cladding layer on the shaft mechanism;
disposing a sliding plate on the frame, and fixing the sliding plate with an elastic member on the frame;
pushing the sliding plate causing a side of the sliding plate to abut against a side surface of a first support plate; and
bonding a flexible display panel to the flexible cladding layer, the sliding plate and the frame; wherein:
the shaft support structure for carrying the flexible display panel has a flat area and at least one bending area, and the shaft support structure comprises:
a rigid support part comprising a plurality of rigid support strips, wherein: the plurality of rigid support strips are arranged in parallel with each other; a first gap is provided between two adjacent rigid support strips of the plurality of rigid support strips; a length direction of at least one of the plurality of rigid support strips is perpendicular to a bending direction of the flexible display panel; and an orthographic projection of the rigid support part on the flexible display panel is located in the bending area;
two first support plates arranged parallel to each other with the plurality of rigid support strips, wherein: the two first support plates are located on opposite sides of the rigid support part; a second gap is provided between a first support plate and the rigid support part; and orthographic projections of the two first support plates on the flexible display panel are located in the flat area;
the flexible cladding layer wrapped around the rigid support part and the two first support plates, joining a side, close to the flexible display panel, of the rigid support part, and sides, close to the flexible display panel, of the two first support plates as a whole;
the plurality of rigid support strips comprises three rigid support strips;
a surface, close to the flexible display panel, of at least one of the three rigid support strips is part of a cylindrical surface;
the part of the cylindrical surface protrudes toward the flexible display panel;
a central angle corresponding to the part of the cylindrical surface is less than or equal to 60 degrees; and
the flexible cladding layer comprises:
  a second inclined surface, on a side surface of at least one of the plurality of rigid support strips, adjacent to the first support plate, with an inclination angle greater than or equal to 22.5 degrees;
a first inclined surface, on a side surface of any one of the plurality of rigid support strips excluding the second inclined surface, with an inclination angle greater than or equal to 22.5 degrees; and
a third inclined surface, on a side surface, close to the rigid support part, of one of the two first support plates, with an inclination angle greater than or equal to 22.5 degrees.

* * * * *